United States Patent
Streck et al.

(10) Patent No.: US 7,687,398 B2
(45) Date of Patent: Mar. 30, 2010

(54) TECHNIQUE FOR FORMING NICKEL SILICIDE BY DEPOSITING NICKEL FROM A GASEOUS PRECURSOR

(75) Inventors: Christof Streck, Coswig (DE); Volker Kahlert, Dresden (DE); Alexander Hanke, Radebeul (DE)

(73) Assignee: Advanced Micro Devices, Inc., Austin, TX (US)

( * ) Notice: Subject to any disclaimer, the term of this patent is extended or adjusted under 35 U.S.C. 154(b) by 564 days.

(21) Appl. No.: 11/380,085

(22) Filed: Apr. 25, 2006

(65) Prior Publication Data

US 2007/0004203 A1 Jan. 4, 2007

(30) Foreign Application Priority Data

Jun. 30, 2005 (DE) ............... 10 2005 030 584

(51) Int. Cl.
*H01L 21/44* (2006.01)
(52) U.S. Cl. ............... 438/680; 257/E21.165
(58) Field of Classification Search .......... 257/E31.195, 257/166, E21.165; 438/680
See application file for complete search history.

(56) References Cited

U.S. PATENT DOCUMENTS

| 4,505,949 | A | * | 3/1985 | Jelks .................... 427/562 |
| 6,015,752 | A | * | 1/2000 | Xiang et al. .............. 438/655 |
| 6,132,518 | A | * | 10/2000 | Milinkovic et al. ......... 118/719 |
| 6,180,469 | B1 | | 1/2001 | Pramanick et al. .......... 438/299 |
| 6,287,967 | B1 | * | 9/2001 | Hsieh et al. ............... 438/664 |

FOREIGN PATENT DOCUMENTS

WO WO 2005/034223 A1 4/2005

* cited by examiner

*Primary Examiner*—W. David Coleman
*Assistant Examiner*—Sonya D McCall-Shepard
(74) *Attorney, Agent, or Firm*—Williams, Morgan & Amerson, P.C.

(57) ABSTRACT

Nickel silicide is formed on the basis of a gaseous precursor, such as nickel tetra carbonyl, wherein the equilibrium of the decomposition of this gas may be controlled to obtain a highly selective nickel silicide formation rate. Moreover, any etch step for removing excess nickel may be avoided, since only minute amounts of nickel may form on exposed surfaces, which may then be effectively removed by correspondingly shifting the equilibrium. Consequently, reduced process complexity, enhanced controllability and enhanced tool lifetime may be obtained.

26 Claims, 3 Drawing Sheets

TECHNIQUE FOR FORMING NICKEL SILICIDE BY DEPOSITING NICKEL FROM A GASEOUS PRECURSOR

BACKGROUND OF THE INVENTION

1. Field of the Invention

Generally, the present invention relates to the fabrication of integrated circuits, and, more particularly, to the formation of nickel silicide regions on silicon-containing conductive circuit elements to decrease a sheet resistance thereof.

2. Description of the Related Art

In modern ultra-high density integrated circuits, device features are steadily decreasing to enhance device performance and functionality of the circuit. Shrinking the feature sizes, however, creates certain problems that may partially offset the advantages obtained by reducing the feature sizes. Generally, reducing the size of, for example, a transistor element such as a MOS transistor, may lead to superior performance characteristics due to a decreased channel length of the transistor element, resulting in a higher drive current capability and enhanced switching speed. However, upon decreasing the channel length of the transistor elements, the electrical resistance of conductive lines and contact regions, i.e., of regions that provide electrical contact to the periphery of the transistor elements, becomes a major issue since the cross-sectional area of these lines and regions is also reduced. The cross-sectional area, however, determines, in combination with the characteristics of the material comprising the conductive lines and contact regions, the effective electrical resistance thereof.

Moreover, a higher number of circuit elements per units area also requires an increased number of interconnections between these circuit elements, wherein commonly the number of required interconnects increases in a non-linear manner with the number of circuit elements so that the available real estate for interconnects becomes even more limited.

For advanced applications, such as CPUs, complex ASICs and the like, the majority of integrated circuits are based on silicon, that is, most of the circuit elements contain silicon regions, in crystalline, polycrystalline and amorphous form, doped and undoped, which act as conductive areas. An illustrative example in this context is a gate electrode of a MOS transistor element, which may be considered as a polysilicon line. Upon application of an appropriate control voltage to the gate electrode, a conductive channel is formed at the interface of a thin gate insulation layer and an active region of the semiconducting substrate. Although reducing the feature size of a transistor element improves device performance due to the reduced channel length, the shrinkage of the gate electrode may result in significant delays in the signal propagation along the gate electrode, i.e., the formation of the channel along the entire extension of the gate electrode may be delayed. The issue of signal propagation delay is even exacerbated for polysilicon lines connecting individual circuit elements or different chip regions. Therefore, it is extremely important to improve the sheet resistance of polysilicon lines and other silicon-containing contact regions, such as drain and source regions, to allow further device scaling without compromising device performance. For this reason, it has become standard practice to reduce the sheet resistance of polysilicon lines and silicon contact regions by forming a metal silicide in and on appropriate portions of the respective silicon-containing regions.

With reference to FIGS. 1a-1c, a typical prior art process flow for forming metal silicide on a corresponding portion of a MOS transistor element will now be described as an illustrative example for demonstrating the reduction of the sheet resistance of silicon.

FIG. 1a schematically shows a cross-sectional view of a transistor element 100, such as a MOS transistor, that is formed on a substrate 101 including a silicon-containing region 102. The silicon-containing region 102 is enclosed by an isolation structure 103, which in the present example is provided in the form of a shallow trench isolation usually used for sophisticated integrated circuits. Highly doped source and drain regions 104 including extension regions 105 are formed in the region 102. The source and drain regions 104 including the extension regions 105 are laterally separated by a channel region 106. A gate insulation layer 107 electrically and physically isolates a gate electrode 108 from the underlying channel region 106. Spacer elements 109 are formed on sidewalls of the gate electrode 108. A refractory metal layer 110 is formed over the transistor element 100 with a thickness required for the further processing in forming metal silicide portions.

A typical conventional process flow for forming the transistor element 100, as shown in FIG. 1a, may include the following steps. After defining the active region 102 by forming the shallow trench isolations 103 by means of advanced photolithography and etch techniques, well-established and well-known implantation steps are carried out to create a desired dopant profile in the region 102 and the channel region 106. Subsequently, the gate insulation layer 107 and the gate electrode 108 are formed by sophisticated deposition, photolithography and anisotropic etch techniques to obtain a desired gate length, which is the horizontal extension of the gate electrode 108 in FIG. 1a, i.e., in the plane of the drawing of FIG. 1a. Thereafter, a first implantation sequence may be carried out to form the extension regions 105 wherein, depending on design requirements, additional so-called halo implants may be performed. The spacer elements 109 are then formed by depositing a dielectric material, such as silicon dioxide and/or silicon nitride, and patterning the dielectric material by an anisotropic etch process. Thereafter, a further implantation process may be carried out to form the heavily doped source and drain regions 104.

Prior to the deposition of the refractory metal layer 110, a cleaning process is performed and, subsequently, the refractory metal layer 110 is deposited on the transistor element 100 by, for example, chemical vapor deposition (CVD) or physical vapor deposition (PVD). Frequently, a refractory metal such as titanium, cobalt, nickel and the like is used for the metal layer 110. It turns out, however, that the characteristics of the various refractory metals during the formation of a metal silicide and afterwards in the form of a metal silicide significantly differ from each other. Consequently, selecting an appropriate metal depends on further design parameters of the transistor element 100 as well as on process requirements in following processes. For instance, titanium is frequently used for forming a metal silicide on the respective silicon-containing portions wherein, however, the electrical properties of the resulting titanium silicide strongly depend on the dimensions of the transistor element 100. Titanium silicide tends to agglomerate at grain boundaries of polysilicon and therefore may increase the total electrical resistance, as this effect is pronounced with decreasing feature sizes so that the employment of titanium may not be acceptable for polysilicon lines, such as the gate electrode 108, having a lateral dimension, i.e., a gate length, of 0.5 µm and less.

For circuit elements having feature sizes of this order of magnitude, cobalt may frequently be used as a refractory metal, since cobalt does not substantially exhibit a tendency for blocking grain boundaries of the polysilicon. Although cobalt may successfully be used for feature sizes down to 0.2 μm, a further reduction of the feature size may require a metal silicide exhibiting a significantly lower sheet resistance compared to cobalt silicide for various reasons. For instance, in a typical MOS process flow, the metal silicide may be formed on the gate electrode 108 and the drain and the source regions 104 simultaneously in a so-called self-aligned process. This process flow requires taking into account that, for reduced feature sizes, a vertical extension or depth (with respect to FIG. 1a) of the drain and source regions 104 into the active region 102 also needs to be reduced to suppress so-called short-channel effects. Consequently, a vertical extension or depth of a metal silicide region formed on the gate electrode 108, which should desirably have a vertical extension as large as possible in view of decreasing the gate resistance, is limited by the requirement for shallow or thin metal silicide regions on the drain and source regions.

Therefore, for highly sophisticated transistor elements, nickel is increasingly considered as an appropriate substitute for cobalt as nickel silicide (NiSi) shows a significantly lower sheet resistance compared to cobalt silicide. In the following, it is therefore assumed that the metal layer 110 is substantially comprised of nickel.

After deposition of the metal layer 110, a heat treatment is carried out to initiate a chemical reaction between the nickel atoms and the silicon atoms in those areas of the source and drain regions 104 and the gate electrode 108 that are in contact with the nickel. For example, a rapid thermal anneal cycle may be performed with a temperature in the range of approximately 400-600° C. and for a time period of approximately 30-90 seconds. During the heat treatment, silicon and nickel atoms diffuse and combine to form nickel monosilicide.

FIG. 1b schematically shows the transistor element 100 with correspondingly formed nickel silicide regions 111 in the source and drain regions 104 and a nickel silicide region 112 formed in the gate electrode 108. A respective thickness 111a and 112a of the nickel silicide regions 111, 112 may be adjusted by process parameters such as a thickness of the initial metal layer 110 and/or the specified conditions during the heat treatment. For example, the metal layer 110 may be deposited with a specified thickness, and the temperature and/or the duration of the heat treatment are adjusted so that substantially the entire nickel layer is converted into nickel silicide. Alternatively, the metal layer 110 is deposited with a sufficient thickness and the degree of nickel silicide generation is controlled by the temperature and/or the duration of the heat treatment. Irrespective of the way to control the thickness 111a, 112a, the non-reacted nickel is then selectively removed by any suitable selective wet etch process, as is well known in the art. It should be noted that silicon that may be contained in the sidewall spacer elements 109 and the shallow trench isolations 103 does not substantially take part in the chemical reaction as the silicon therein is provided as a thermally stable oxide or nitride. Moreover, the nickel silicide regions 111, 112 may also be formed in a two-step thermal processing, for example by two rapid thermal anneal cycles, wherein preferably between the two cycles non-reacted nickel may selectively be removed.

Although the thickness 111a may differ from the thickness 112a, due to a different diffusion behavior of the highly doped crystalline silicon of the drain and source regions 104 and the doped polysilicon of the gate electrode 108, both thicknesses are correlated as they may not be adjusted independently from each other without considerably changing the entire process flow. Therefore, a maximum thickness 112a of nickel silicide on the gate electrode 108 is determined by the maximum allowable thickness 111a, which in turn is restricted by the depth of the drain and source region 104. Despite of the fact that nickel silicide exhibits a significantly lower sheet resistance than, for example, cobalt silicide, it turns out that nickel silicide is thermally not stable at temperatures exceeding approximately 400° C. and converts upon elevated temperatures to nickel disilicide ($NiSi_2$). The formation of nickel disilicide instead of nickel silicide is highly undesirable since nickel disilicide has a significantly higher sheet resistance compared to nickel monosilicide. Moreover, the ongoing chemical reaction consumes further silicon and thus increases the thickness of the corresponding nickel silicide regions.

Consequently, a precise process control of the entire nickel silicide formation process is required particularly for highly scaled transistor elements. This is to say that each of the individual process steps, such as the cleaning step prior to the nickel deposition, the actual deposition process, the heat treatment, the selective removal of excess nickel and optional further heat treatments, requires a precise control to maintain the variance of the nickel silicide regions within tightly set tolerances, which is and may increasingly become a difficult and complex task for advanced semiconductor devices.

In view of the situation described above, a need exists to eliminate or at least reduce some of the problems involved in processing nickel in highly sophisticated integrated circuits.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the formation of nickel silicide on the basis of a gaseous precursor material, wherein, in particular embodiments of the present invention, the nickel silicide formation is an in situ process, in which the nickel deposition and the reaction with the underlying silicon are accomplished in a common single process.

In accordance with an illustrative embodiment of the present invention, a method comprises exposing a semiconductor device comprising an exposed silicon-containing region to a deposition ambient, which includes a nickel-containing gaseous precursor to selectively deposit nickel on the exposed silicon-containing region. Moreover, nickel is converted into nickel silicide in the exposed silicon-containing region.

According to another illustrative embodiment of the present invention, a method comprises forming a nickel silicide region in an exposed silicon-containing region of a semiconductor device in a nickel tetra carbonyl ($Ni(CO)_4$) containing deposition ambient.

In accordance with yet another illustrative embodiment of the present invention, a deposition system comprises a reactor configured to supply gaseous nickel tetra carbonyl, a process chamber, which is in fluid connection with the reactor, and a substrate holder that is located within the process chamber and that is configured to receive and hold a semiconductor substrate. Moreover, the system comprises a heating unit configured to controllably heat the substrate, and a carrier gas supply is provided, which is in fluid connection with the process chamber. Additionally, the system comprises a control unit configured to control at least one of the reactor, the carrier gas supply and the heating unit.

BRIEF DESCRIPTION OF THE DRAWINGS

The invention may be understood by reference to the following description taken in conjunction with the accompanying drawings, in which like reference numerals identify like elements, and in which.

Figure 1A:
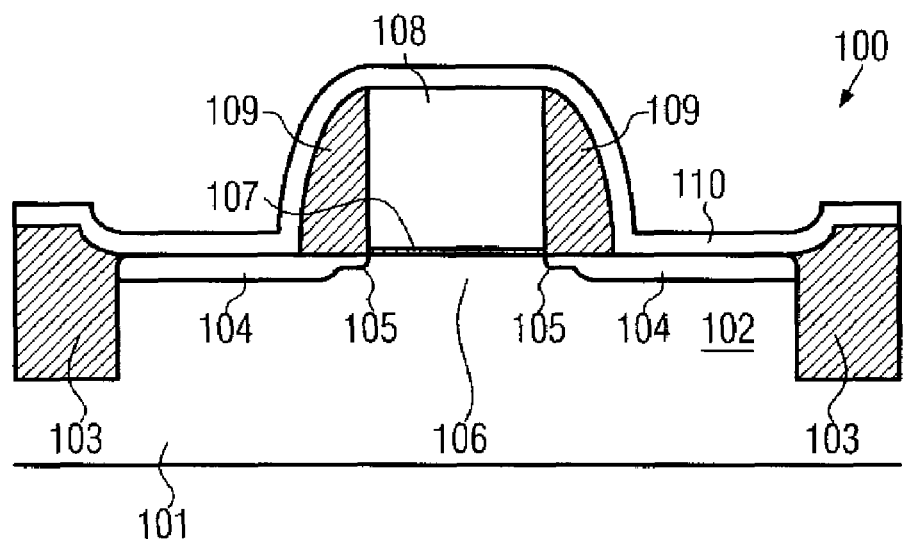
FIGS. 1a and 1b schematically show cross-sectional views of a semiconductor device during the formation of nickel silicide in accordance with a typical conventional process flow.
Figure 1B:
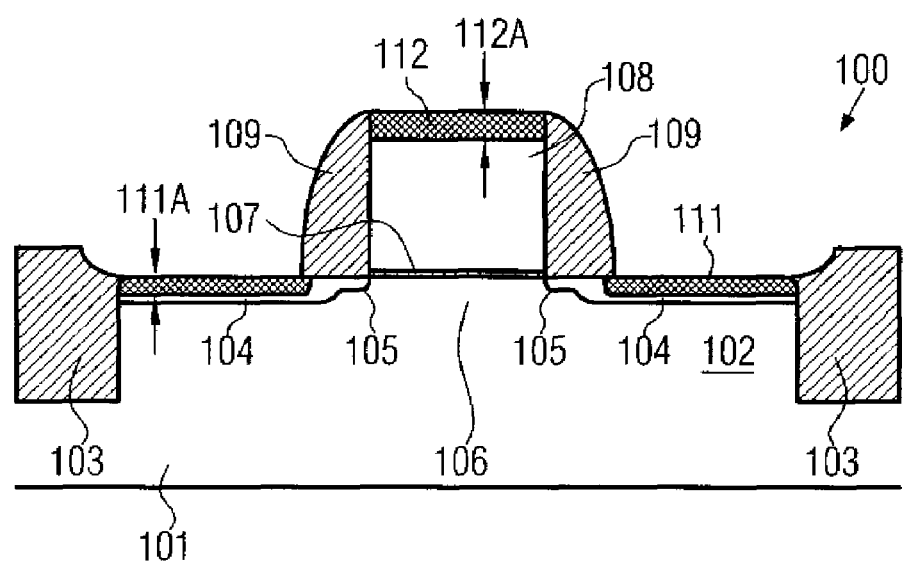

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i. e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention is directed to a technique that may have the potential to significantly reduce the process complexity involved in the conventional formation of nickel silicide in and on silicon-containing regions, such as gate electrodes, polysilicon lines, drain and source regions and the like, of advanced semiconductor devices, thereby providing enhanced process controllability even for highly scaled devices requiring extremely shallow and well-controlled nickel silicide regions. For this purpose, the deposition of nickel may be based on a gaseous precursor material, wherein process parameters of a deposition ambient may be adjusted to obtain a high deposition selectivity. The selective deposition of nickel from a gaseous component on exposed silicon surfaces may significantly reduce any efforts for removing non-reacted nickel material from non-desired substrate portions and from surfaces of a process chamber. Consequently, complex cleaning processes, such as selective removal of non-reacted nickel, as well as cleaning the process chamber, may be significantly reduced or may even be completely avoided, thereby also enhancing throughput and tool utilization and tool lifetime.

One viable candidate for a gaseous precursor material for the deposition of nickel is nickel tetra carbonyl ($Ni(CO)_4$)), which is a volatile species having a melting point of $-19.3°$ C. and a boiling point of $42.2°$ C. under standard pressure conditions. Nickel tetra carbonyl may be formed from a nickel-containing base material, such as nickel oxide, at elevated temperatures in the presence of hydrogen and carbon monoxide, which are also referred to as water gas. The resulting nickel tetra carbonyl may then be used as a gaseous precursor for the formation of highly pure nickel on the basis of a decomposition reaction at temperatures above approximately $230°$ C. in accordance with the following formula:

$$Ni(CO)_4 \Longleftrightarrow Ni + 4CO\ (230°\ C.)$$

According to the principle of the present invention, the equilibrium of this decomposition reaction may be used to form highly pure nickel on an exposed silicon-containing region, wherein a high degree of selectivity may be obtained by applying elevated temperatures of approximately 250-400° C., at which nickel and silicon react to form nickel silicide according to the following equation:

$$Ni + Si \Longrightarrow NiSi\ (approx.\ 250\text{-}400°\ C.)$$

Consequently, on the basis of the above decomposition reaction, pure nickel may be deposited which may then immediately react with silicon of the exposed silicon-containing region, thereby continuously consuming nickel, which is then continuously supplied by the above decomposition mechanism, thereby generating a nickel silicide in a very controlled and selective manner. On the other hand, a nickel deposition at colder surfaces, such as process chamber walls and the like, and at substrate regions that do not react with nickel at the above specified temperature range of approximately 250-400° C., is significantly suppressed. For this reason, any excess material removal process and/or chamber clean runs may significantly be reduced or may even be completely avoided, in particular, as even tiny amounts of nickel, which may have been deposited on dielectric layers, chamber wall surfaces and the like may be efficiently removed on the basis of the above decomposition mechanism, in that the supply of nickel tetra carbonyl is discontinued while still supplying carbon monoxide to promote the formation of nickel tetra carbonyl, wherein the required nickel is supplied by these contaminated surfaces. Consequently, reduced process complexity at the benefit of an enhanced controllability may be offered by the CVD-like nickel silicide formation according to the present invention.

It should be noted that in the following illustrative embodiments of the present invention, it is referred to a field effect transistor, such as a MOS transistor element, to demonstrate the principle of improving the conductivity of silicon-containing conductive regions by providing a nickel silicide in those regions in a highly selective and controllable fashion. The present invention may, however, be readily applied to any silicon-containing regions, for example provided in the form of doped or undoped crystalline silicon, doped or undoped polycrystalline silicon and doped or undoped amorphous silicon, irrespective of the type of circuit element of interest. For example, any polysilicon lines or areas connecting adjacent circuit elements, such as transistors, resistors, capacitors and the like, or connecting different chip areas as well as certain silicon-containing portions of any type of circuit elements, for instance electrodes of capacitors, contact portions of resistors and the like, should be understood to be encompassed by the present invention and should be considered as being represented by the silicon-containing conductive region included in the transistor element described with reference to FIGS. 2a and 2b in the following description.

Figure 2A:
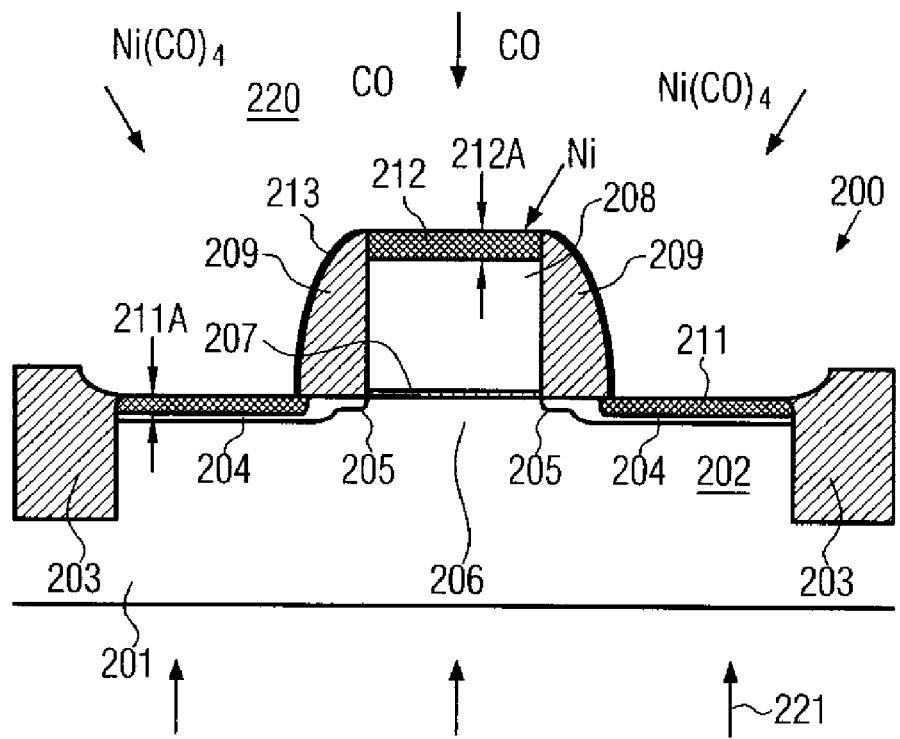
FIGS. 2a and 2b schematically show cross-sectional views of a semiconductor device during the formation of nickel silicide on the basis of a gaseous precursor material in accordance with illustrative embodiments of the present invention.

FIG. 2a schematically shows a cross-sectional view of a transistor element 200 comprising a substrate 201, which may represent a bulk silicon substrate, an SOI substrate, or any other appropriate substrate having formed thereon a silicon-containing crystalline layer to define therein a silicon region 202, which is enclosed by an isolation structure 203 that may be provided in the form of a shallow trench isolation. It should be appreciated that the term "silicon region" or "silicon-containing region" as used herein and in the appended claims may also encompass any silicon region that may comprise other materials such as germanium, carbon and the like, as is often used for modifying the charge carrier mobility in such crystalline semiconductor regions. Moreover, the term "silicon region" or "silicon-containing region" may also refer to any silicon-based regions having formed therein any dopants so as to modify the charge carrier concentration therein. Thus, a silicon region could be understood as a region that comprises silicon that is available for a silicide reaction at elevated temperatures in the range of approximately 250-400° C., when brought into contact with nickel. Hence, any dielectric regions, such as silicon dioxide regions, silicon nitride regions as may be included in the isolation structure 203, may not be regarded as silicon regions or silicon-containing regions in the above-specified sense, since silicon dioxide and silicon nitride do not substantially react with nickel in the above-specified temperature range.

The transistor element 200 further comprises a gate electrode 208 formed of polycrystalline silicon, which is located above the silicon region 202 and separated therefrom by a gate insulation layer 207. In some embodiments, the gate electrode 208 may have a length, i.e., the horizontal extension of the gate electrode 208, of 100 nm and significantly less, and may even have a gate length of 50 nm and even less for highly scaled transistor devices. The transistor element 200 may further comprise sidewall spacer elements 209, which may be formed by any appropriate combination of dielectric materials, such as silicon nitride, silicon dioxide and the like. Moreover, drain and source regions 204 are formed within the silicon-containing region 202, wherein respective extension regions 205 may extend below the sidewall spacers 209 so as to define an effective channel length of a channel region 206 located between the respective extension regions 205. Furthermore, nickel silicide regions 211 are formed in and on a portion of the drain and source regions 204, while a corresponding nickel silicide region 212 is formed in and on the gate electrode 208.

A typical process flow for forming the transistor element 200 as shown in FIG. 2a may comprise the following processes. The trench isolation structure 203 as well as the gate electrode 208 formed above the gate insulation layer 207 may be formed in accordance with well-established conventional manufacturing techniques. That is, well-known process recipes for photolithography, etch, deposition and oxidation processes may be applied to form the isolation structure 203 and to pattern the gate electrode 208 after the formation of the gate insulation layer 207. Thereafter, ion implantation processes may be performed, possibly intermittently with the formation of the spacer 209, in order to obtain the required vertical and lateral dopant profile for the drain and source regions 204 and the extension regions 205. The corresponding dopant profiles may then be annealed so as to re-crystallize implantation-induced damage and activate the dopant species. Thereafter, a well-established cleaning process may be performed to remove surface contaminations and material residues resulting from previous processes from the drain and source regions 204 and the gate electrode 208 prior to the deposition of nickel, similarly as is in the conventional process flow, previously described with reference to FIG. 1a.

After the cleaning process, contrary to the conventional technique, the transistor element 200 is exposed to a deposition ambient, indicated as 220, which comprises a nickel-containing gaseous precursor material and which has the required condition, such as pressure, temperature and the like, for depositing nickel on exposed silicon regions, i.e., on the drain and source regions 204 and the gate electrodes 208. In one particular embodiment, the deposition ambient 220 comprises nickel tetra carbonyl ($Ni(CO)_4$)), which may partially decompose in accordance with the above-described equation under specified conditions of the deposition ambient 220. For this purpose, in one illustrative embodiment, the substrate 201 is heated, as indicated by 221, thereby also heating the exposed silicon regions, i.e., the drain and source regions 204 and the gate electrode 208 to or above a temperature of approximately 250° C., which may initiate a chemical reaction between nickel and silicon upon the deposition of nickel. Due to the elevated temperature in the vicinity of the device 200, a certain equilibrium of nickel and carbon monoxide with respect to non-decomposed nickel tetra carbonyl will be established so that highly pure nickel may deposit on the transistor element 200, while releasing carbon monoxide into the deposition ambient 220. As previously explained, the nickel depositing on the exposed silicon regions, i.e., the drain and source regions 204 and the gate electrodes 208, may immediately react with the silicon to create nickel silicide, whereas any tiny amounts of nickel, indicated as 213, which may deposit on the sidewall spacers 209 and the isolation structure 203, may substantially remain unaffected, since the deposition ambient 220 also defines the same equilibrium at these locations, thereby strongly suppressing a further nickel deposition, as substantially no nickel is consumed by the underlying material. In this way, a highly selective nickel silicide formation is achieved, wherein the nickel silicide growth may be controlled by controlling at least one parameter of the deposition ambient 220.

For example, the partial pressure of carbon monoxide may be controlled in order to appropriately adjust the equilibrium between nickel tetra carbonyl and the decomposed nickel and carbon monoxide, thereby providing a controlled rate for the creation of nickel silicide in the regions 204 and 208. In addition or alternatively, other process parameters, such as the temperature of the substrate 201 and thus the temperature of surface portions of the element 200, as well as the supply rate of nickel tetra carbonyl, the overall pressure of the ambient 220 and the like, may be correspondingly adjusted to appropriately set the production rate of nickel silicide. Appropriate process recipes for establishing the deposition ambient 220 may readily be established on the basis of test runs. For example, the dependency of thicknesses 212*a* and 211*a* of nickel silicide from one or more process parameters may be determined for highly doped polysilicon and highly doped crystalline silicon or any other material that may be used during the formation of the device 200, such as silicon/germanium and the like. For this purpose, a plurality of deposition ambients 200 may be established, each of which may have a different set of parameters. The corresponding thicknesses 211*a*, 212*a* during these test runs may then be determined for each of the different process recipes of the individual ambients 220. Corresponding thickness measurements may be performed on the basis of cross-sectional analysis by electron microscopy or by any other appropriate measurement process.

Once a suitable set of parameters is obtained, the deposition ambient 220 may be established in accordance with this process recipe and the control of the deposition ambient 220 may be performed on the basis of one or more of the process parameters involved. For example, if the deposition ambient 220 is specified for a certain pressure, which is substantially determined by the provision of a respective carrier gas, such as argon, helium and the like, and a specified supply rate for the nickel-containing precursor gas in combination with an appropriate temperature for heating the substrate 201 is used, an efficient control of the process of forming nickel silicide may be established by monitoring and re-adjusting one or more of the parameters determining the deposition ambient 220. For instance, a suitable manipulated parameter in a corresponding deposition process is represented by the partial pressure of carbon monoxide, which enables an effective adjustment of the equilibrium and thus of the nickel silicide creation rate. In such a control regime, carbon monoxide may be selectively removed or added to the deposition ambient 220 to maintain a substantially stable and uniform creation rate for a plurality of substrates. To this end, an advanced process control (APC) algorithm may be used. As previously explained, due to the fact that the nickel silicide formation process may be controlled on the basis of a deposition ambient without requiring any subsequent anneal cycles, possibly with intermediate etch removal steps for removing non-reacted metal, as is the case in the conventional process flow, a highly sensitive control mechanism is provided, which is readily applicable to highly scaled devices. It should be appreciated, however, that in other embodiments the nickel deposition and the nickel silicide formation may be "decoupled," similar as in conventional process techniques, in that a process temperature may be selected significantly below an activation temperature for starting a nickel silicide production. In this case, highly pure nickel may be conformally deposited on any exposed surface of the element 200 and subsequently the nickel may be reacted with the underlying silicon upon heating the substrate 201 above the required activation temperature.

In other embodiments, formation of the nickel silicide regions 212 and 211 may not be performed in a common process, but may instead be performed in separate processes. For example, the drain and source regions 204 may be masked, for instance by a resist mask (not shown) that is configured to withstand a temperature of approximately 250° C., while the gate electrode 208 may be exposed to the deposition ambient 220. After the formation of the silicide region 212 in and on the gate electrode 208, the resist mask may be removed and the deposition ambient 220 may be re-established to form the regions 211 having the required thickness 211*a*. In this way, a significantly increased thickness 212*a* may be obtained in the gate electrode 202 in a substantially independent manner, wherein the required target thickness 211*a* in the drain and source regions 204 may still be achieved. In other embodiments, different types of metal silicides may be formed, wherein advantage may be taken from the fact that nickel silicide may be highly selectively formed without requiring a subsequent selective etch step for removing non-reacted nickel, as is the case in conventional techniques. For this purpose, for instance cobalt silicide may be formed on the drain and source regions 204, while the gate electrode 208 may be covered by any appropriate cap layer (not shown). After the removal of the cap layer, nickel silicide may be selectively formed in the gate electrode 208, wherein a moderately low temperature may be selected so as to avoid a chemical reaction between nickel and cobalt silicide in the drain and source regions 204. In this case, only a minute amount of nickel may be deposited on the cobalt silicide due to the same mechanism as explained above. Thus, the high degree of selectivity in forming metal silicide provides an enhanced flexibility in designing advanced semiconductor devices that may require different types of metal silicide without unduly affecting sensitive device regions. In the above example, any processes for removing non-reacted nickel, which may in conventional process schemes produce etch-induced damage in the previously formed cobalt silicide regions, may not be required, thus providing enhanced device integrity. It should be appreciated that the gate electrode 208 and the drain and source regions 204 may represent any different semiconductor regions that are to receive a metal silicide. For instance, the gate electrode 208 may represent one type of transistor which requires a nickel silicide, while the drain and source 204 regions may represent a different type of transistor requiring, for instance, a cobalt silicide.

Figure 2B:
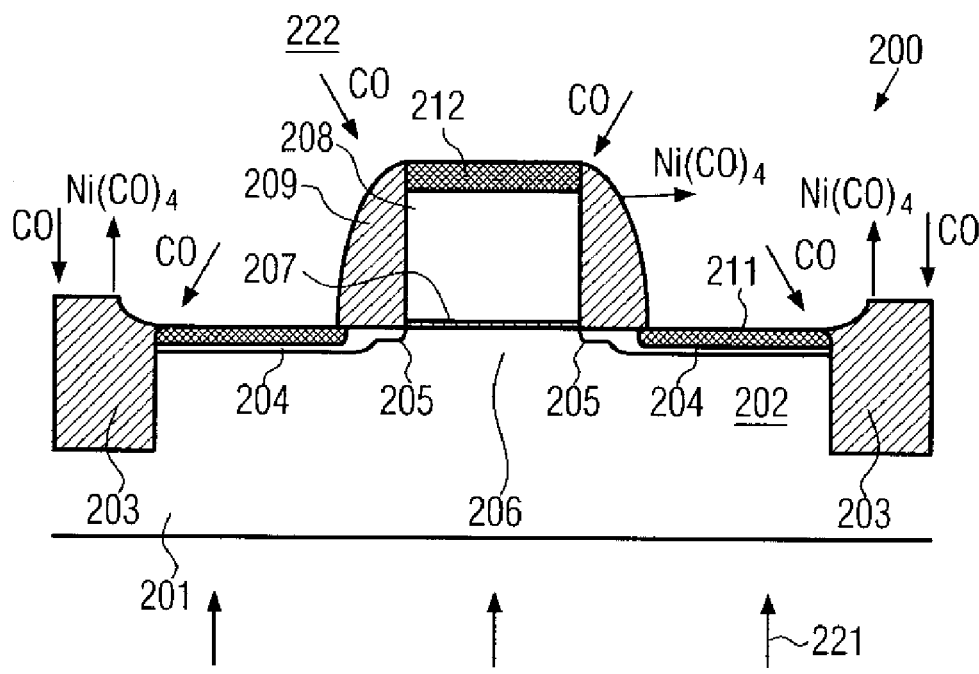

FIG. 2*b* schematically shows the transistor element 200 in an advanced manufacturing stage, in which minute amounts of nickel 213 may be removed from surfaces, such as from the sidewall spacer 209, the trench isolation 203 and possibly from process chamber walls and the like. For this purpose, the supply of nickel tetra carbonyl may be discontinued and a cleaning ambient 222 may be established, which comprises a high amount of carbon monoxide or which may be comprised of pure carbon monoxide. In this case, the equilibrium, as described above, is shifted to the right hand side of the above formulae and hence nickel tetra carbonyl is preferably formed as a result of the excess carbon monoxide of the ambient 222 and the nickel present on some surfaces of the device 200 or on any components of the process chamber. Thus, even the tiny amounts of nickel 213 which may have been deposited during the exposure to the deposition ambient 220, may be efficiently removed or at least be significantly reduced. In one illustrative embodiment, the process of removing unwanted nickel may be performed in situ by transitioning from the deposition ambient 220 to the ambient 222. In other embodiments, additionally the temperature supplied to the substrate 201 may be adjusted to a different value compared to the value used in the deposition ambient 220 in order to avoid undue nickel removal from the nickel silicide regions 211, 212 and/or to perform a further stabilizing step so as to "reinforce" the nickel silicide regions 211, 212 in view of the further processing of the transistor element 200. In other embodiments, a separate heating step for a thermal stabilization of the regions 211, 212 may be performed in a separate process tool, when high throughput is required, since then a plurality of substrates 201 may be heat treated in a common process. In still other embodiments, the heat treatment of a plurality of devices 200 for thermal stabilization may be performed in a separate process tool having established therein the ambient 222 so as to also efficiently remove any excess nickel from exposed surfaces.

Thereafter, the further processing of the device 200 may be performed in accordance with well-established process flows, wherein product yield may be enhanced due to the nickel silicide regions 211, 212, which may have been formed with enhanced control and reliability compared to conventional processes.

Figure 2C:
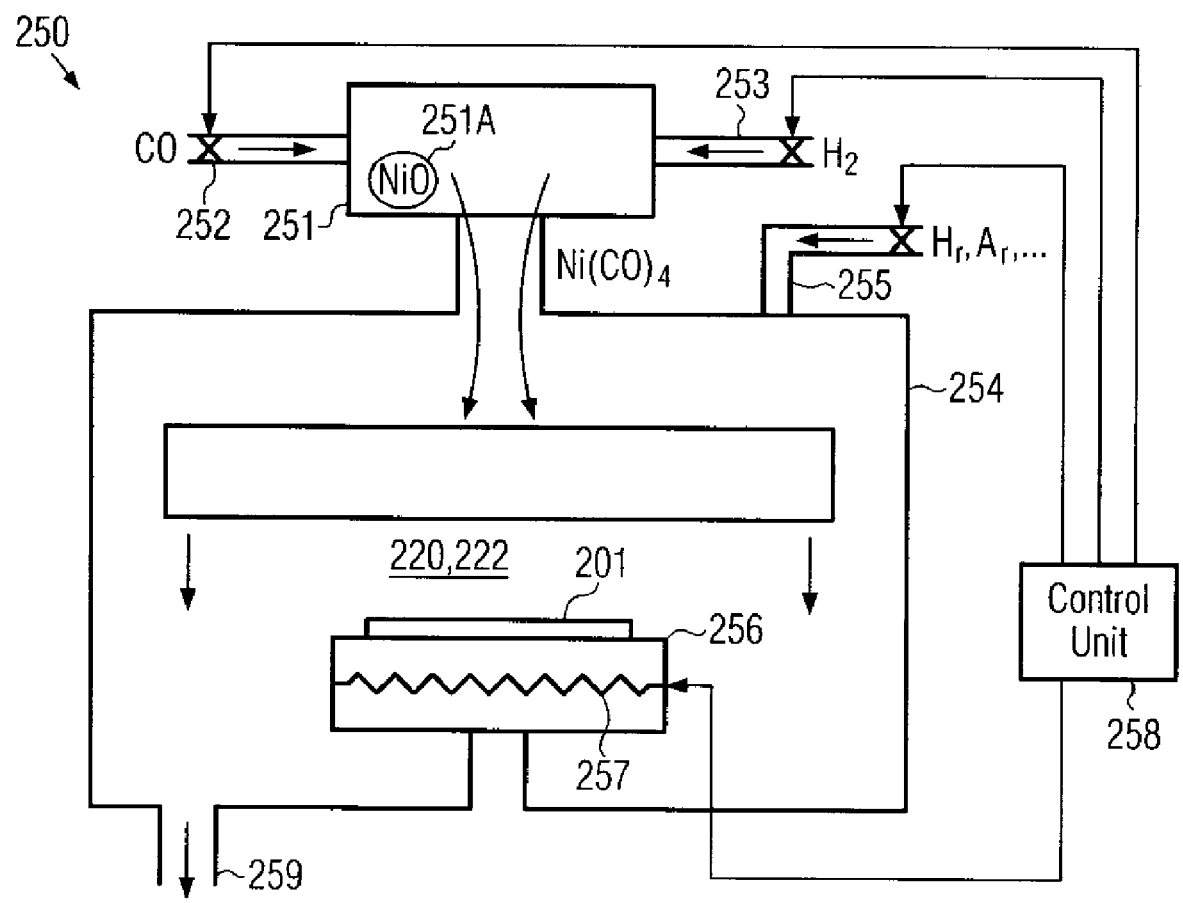
FIG. 2c schematically shows a deposition system including a reactor for supplying nickel tetra carbonyl according to still further illustrative embodiments of the present invention.

FIG. 2c schematically shows a deposition system 250 that is configured to form nickel silicide on the basis of the deposition ambient 220 as described with reference to FIG. 2a. The system 250 may comprise a reactor 251, which is configured to provide gaseous nickel tetra carbonyl in a controllable fashion to a process chamber 254. The process chamber 254 is configured to create and maintain at least the deposition ambient 220 and, in some embodiments, is also configured to establish and maintain the ambient 222 for removing excess nickel from the substrate 201. The process chamber 254 may be connected to a supply source 255 for one or more carrier gases, such as helium, argon and the like. Furthermore, the process chamber 254 may have appropriate means 259 for discharging any exhaust gases and materials and to provide a stabilized gas pressure within the process chamber 254. Moreover, the system 250 comprises a substrate holder 256 within the chamber 254, which is configured to receive and hold a semiconductor substrate, such as the substrate 201, which may have formed thereon the semiconductor device 200. In one illustrative embodiment, the substrate holder 256 has formed therein a heating unit 257, which is configured to enable the provision of a temperature at least in the range of approximately 250-400° C., as is required for the creation of nickel silicide. Furthermore, the system 250 comprises a control unit 258, which is operatively connected to at least the carrier gas supply 255, the heating unit 257 and the reactor 251.

Upon operation of the system 250, the control unit 258 may instruct the corresponding components to establish a deposition ambient, such as the ambient 220 previously described, in order to deposit nickel and to create nickel silicide as is described above.

In one particular embodiment, the reactor 251 may be configured to initially create nickel tetra carbonyl on the basis of a nickel-containing target, such as a nickel oxide target 251a, and carbon monoxide and hydrogen, which may be supplied by respective sources 252, 253, which are in fluid connection with the reactor 251. In this case, the production rate for nickel tetra carbonyl may be controlled on the basis of the partial pressures of hydrogen and carbon monoxide supplied by the sources 252 and 253. Hence, the deposition ambient established within the process chamber 254 may also be controlled on the basis of the respective partial pressures of carbon monoxide and hydrogen in addition to other process parameters, as is previously described with reference to FIG. 2a. As previously described, upon discontinuation of the production of nickel tetra carbonyl, the nickel silicide formation may be stopped and the ambient 222 may be established by providing a required amount of carbon monoxide to remove any unwanted nickel from the substrate 201 and possibly from any chamber components. It should be appreciated, however, that the local heating of the substrate 201 by means of the heating unit 257 does not substantially affect any chamber components other than the substrate holder 256 and thus these components may remain at a moderately low temperature, thereby significantly suppressing any nickel deposition thereon. Consequently, the system 250 may be used for processing a plurality of substrates without requiring any excessive cleaning steps, thereby also improving overall lifetime of the process chamber 254 as well as tool throughput and production yield.

As a result, the present invention provides a technique for the formation of nickel silicide in exposed regions of semiconductor devices in a highly selective manner, wherein nickel is deposited on the basis of a gaseous precursor which, in one particular embodiment, is represented by nickel tetra carbonyl. During the deposition of nickel, the substrate may be maintained at an elevated temperature, which not only ensures a significant decomposition of nickel tetra carbonyl but also provides the required activation energy for initiating the reaction of nickel and silicon. Consequently, significant amounts of nickel are deposited on exposed silicon regions only, while other dielectric regions as well as process chamber components may receive only minute amounts of nickel, which may then be efficiently removed by purging the substrate and the process chamber in a carbon monoxide enriched atmosphere. Due to the nickel silicide formation on the basis of a gas phase reaction, the present invention enables a further device scaling, which may require highly controlled and shallow nickel silicide regions. Moreover, the process for the formation of nickel silicide may, except for a pre-deposition cleaning step, in some embodiments, be designed as a one-step process, thereby providing enhanced throughput, process flexibility and cost efficiency. Moreover, intermittent chamber cleaning processes may not be required, thereby also contributing to an enhanced throughput and cost-effectiveness.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:

exposing a semiconductor device comprising an exposed silicon-containing region to a deposition ambient including a nickel-containing gaseous precursor, said semiconductor device being formed in and above a semiconductor substrate;

maintaining a temperature of said substrate in a range that will substantially immediately initiate a conversion of nickel deposited on said silicon-containing region of said semiconductor device to a nickel silicide;

selectively depositing nickel on said exposed silicon-containing region by at least partially decomposing said nickel-containing gaseous precursor; and substantially immediately converting said deposited nickel to a nickel silicide, said nickel silicide positioned at least partially in an upper portion of said exposed silicon containing region.

2. The method of claim 1, wherein converting said deposited nickel to nickel silicide is initiated while said silicon-containing region is exposed to said deposition ambient.

3. The method of claim 1, wherein said deposition ambient comprises nickel tetra carbonyl (Ni(CO)$_4$).

4. The method of claim 1, wherein said exposed silicon-containing region is at least one of a polysilicon region and a crystalline region of a MOS structure.

5. The method of claim 1, further comprising determining a target thickness of said nickel silicide, determining a process recipe for controlling said deposition ambient so as to substantially obtain said target thickness when forming said nickel silicide at least partially in said upper portion of said exposed silicon-containing region of said semiconductor device, and processing one or more further substrates with said determined process recipe.

6. The method of claim 1, further comprising discontinuing supply of said nickel-containing gaseous precursor and heat treating said substrate for stabilizing said nickel silicide.

7. The method of claim 1, wherein said exposed silicon region of said semiconductor device is at least one of a conductive line, a gate electrode, a drain region and a source region.

8. The method of claim 2, wherein said temperature of said substrate is maintained in a range of approximately 250-400° C.

9. The method of claim 3, wherein said deposition ambient comprises carbon monoxide.

10. The method of claim 3, further comprising forming said nickel tetra carbonyl in a reactor that is in fluid communication with said deposition ambient.

11. The method of claim 6, wherein said heat treatment is performed in situ.

12. The method of claim 9, further comprising controlling a thickness of said nickel silicide by controlling at least one of a temperature of said substrate, a flow rate of nickel tetra carbonyl, a partial pressure of carbon monoxide and a flow rate of an inert carrier gas.

13. The method of claim 10, further comprising controlling said deposition ambient by controlling at least one of a partial pressure of carbon monoxide and a partial pressure of hydrogen used for forming said nickel tetra carbonyl.

14. The method of claim 12, further comprising discontinuing supply of said nickel tetra carbonyl after a specified deposition period and maintaining supply of carbon monoxide.

15. A method, comprising forming a nickel silicide region in an upper portion of an exposed silicon-containing region of a semiconductor device formed above a semiconductor substrate in a nickel tetra carbonyl ($Ni(CO)_4$) containing deposition ambient, wherein forming said nickel silicide region comprises at least partially decomposing said nickel tetra carbonyl.

16. The method of claim 15, wherein forming said nickel silicide region comprises maintaining said substrate at a temperature in the range of approximately 250-400° C.

17. The method of claim 15, wherein said deposition ambient comprises carbon monoxide.

18. The method of claim 15, wherein said exposed silicon region is at least one of a polysilicon region and a crystalline region of a MOS structure.

19. The method of claim 15, further comprising determining a target thickness of said nickel silicide, determining a process recipe for controlling said deposition ambient so as to substantially obtain said target thickness when forming said nickel silicide in said upper portion of said exposed silicon-containing region of said semiconductor device, and processing one or more further substrates with said determined process recipe.

20. The method of claim 15, further comprising discontinuing supply of said nickel tetra carbonyl containing deposition ambient and heat treating said substrate for stabilizing said nickel silicide.

21. The method of claim 15, further comprising forming said nickel tetra carbonyl in a reactor that is in fluid communication with said deposition ambient.

22. The method of claim 15, wherein said exposed silicon region of said semiconductor device is at least one of a conductive line, a gate electrode, a drain region and a source region.

23. The method of claim 17, further comprising controlling a thickness of said nickel silicide by controlling at least one of a temperature of said substrate, a flow rate of nickel tetra carbonyl, a partial pressure of carbon monoxide and a flow rate of an inert carrier gas.

24. The method of claim 20, wherein said heat treatment is performed in situ.

25. The method of claim 21, further comprising controlling said deposition ambient by controlling at least one of a partial pressure of carbon monoxide and a partial pressure of hydrogen used for forming said nickel tetra carbonyl.

26. The method of claim 23, further comprising discontinuing supply of said nickel tetra carbonyl after a specified deposition period and maintaining supply of carbon monoxide.

* * * * *